United States Patent
Hayward et al.

(10) Patent No.: US 6,377,470 B1
(45) Date of Patent: *Apr. 23, 2002

(54) CARD GUIDE INCLUDING AIR DEFLECTOR MEANS AND AIR DEFLECTOR MEANS FOR A COOLING CARD GUIDE

(75) Inventors: C. Michael Hayward, Harvard; Richard N. Rehlander, Billerica, both of MA (US)

(73) Assignee: Hybricon Corporation, Ayer, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/674,371
(22) PCT Filed: Apr. 30, 1999
(86) PCT No.: PCT/US99/09445
§ 371 Date: Oct. 27, 2000
§ 102(e) Date: Oct. 27, 2000
(87) PCT Pub. No.: WO99/60834
PCT Pub. Date: Nov. 25, 1999

Related U.S. Application Data

(63) Continuation-in-part of application No. 09/094,179, filed on Jun. 9, 1998.
(60) Provisional application No. 60/085,627, filed on May 15, 1998.

(51) Int. Cl.[7] .............................. H05K 7/14; H05K 7/20
(52) U.S. Cl. ...................... 361/796; 361/688; 361/720; 361/753; 361/756; 361/802; 211/41.17; 165/80.3
(58) Field of Search .................. 361/688, 690–697, 361/720, 753, 756, 799, 800–802, 816; 211/41.17; 206/706.19; 174/35 R; 165/80.3

(56) References Cited

U.S. PATENT DOCUMENTS

| | | | | |
|---|---|---|---|---|
| 3,696,936 A | * | 10/1972 | Straccia et al. | 211/41.17 |
| 4,171,859 A | * | 10/1979 | Altoz et al. | 439/61 |
| 4,335,819 A | * | 6/1982 | Weisman et al. | 211/41.17 |
| 4,466,049 A | * | 8/1984 | Chaney et al. | 361/691 |
| 4,750,088 A | * | 6/1988 | Friot | 361/690 |
| 5,210,680 A | * | 5/1993 | Scheibler | 361/796 |

FOREIGN PATENT DOCUMENTS

JP  2-4000  * 2/1990

* cited by examiner

Primary Examiner—Jayprakash N. Gandhi
(74) Attorney, Agent, or Firm—Mills & Onello LLP

(57) ABSTRACT

A card guide which optimizes the flow of forced cooling air, provides for self alignment to a host motherboard and provides for integrated electro-static discharge (ESD) hazard mitigation. includes an elongated body having a groove disposed along a longitudinal axis of the body. The groove is adapted for receiving the edge of an inserted daughter card. The card guide further includes integral, arcuate inner and outer deflectors, which form a channel for redirecting incident air flow toward regions of the daughter card which would otherwise be blocked from the air flow. Extension deflector assemblies may be situated between card guides to extend the inner and outer deflectors so as to minimize air flow discontinuities in regions between daughter card positions. The end of the card guide that receives the daughter card houses an ESD clip. The ESD clip functions to dissipate static charge accumulated on the daughter card from a conductive strip disposed along the edge of the daughter card. The ESD clip further serves to dissipate accumulated static charge from a front panel attached to the daughter card, via a guide pin fixedly attached to the front panel. The end of the card guide proximate to the motherboard includes an alignment pin, which engages a corresponding aperture in the motherboard to properly register the card guide to the associated connector on the motherboard.

27 Claims, 12 Drawing Sheets

FIG. 3A
(PRIOR ART)
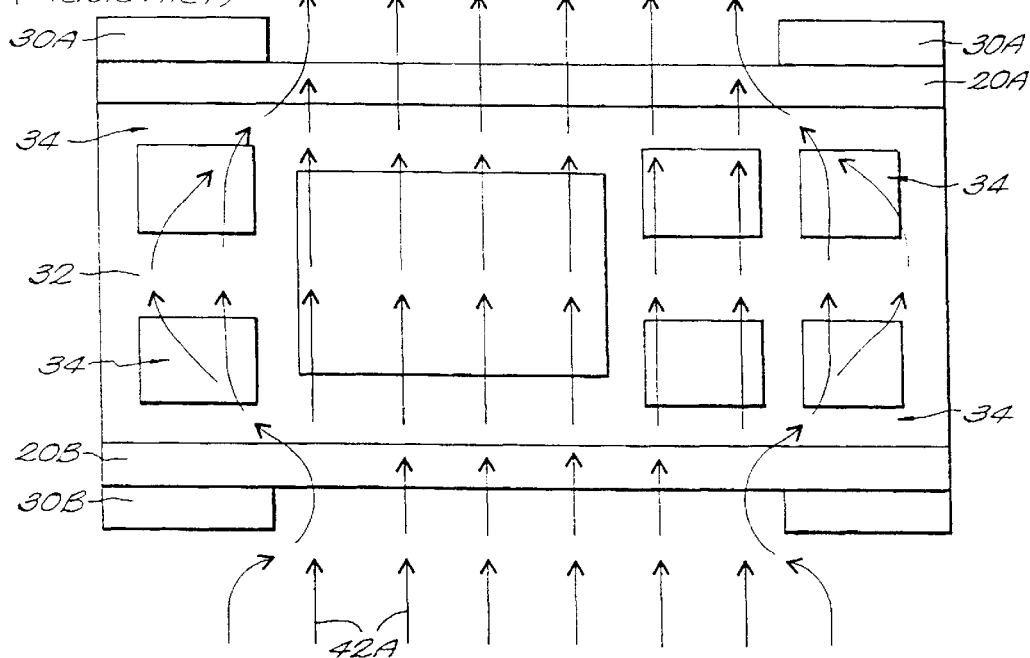
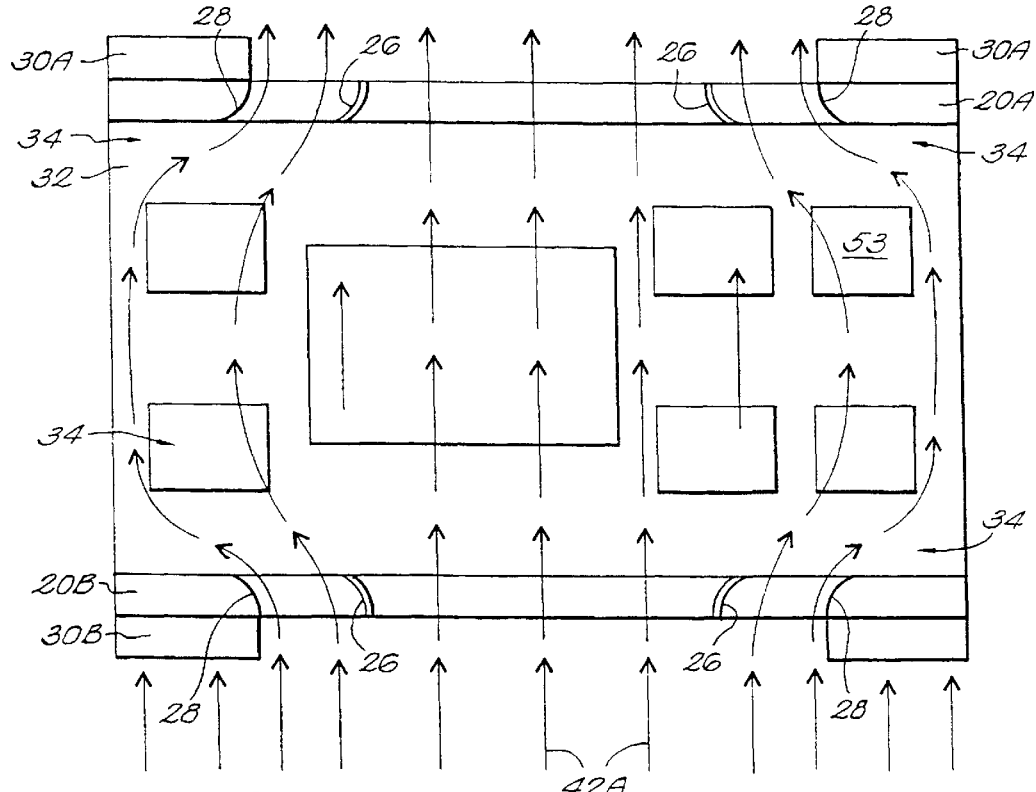
FIG. 3B

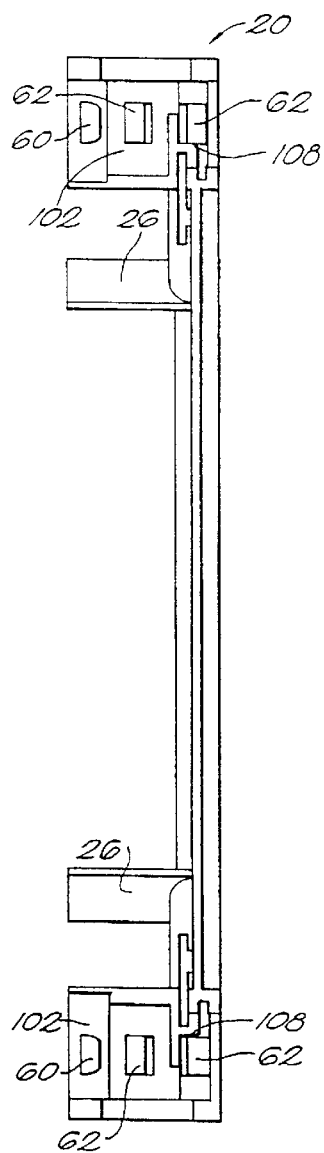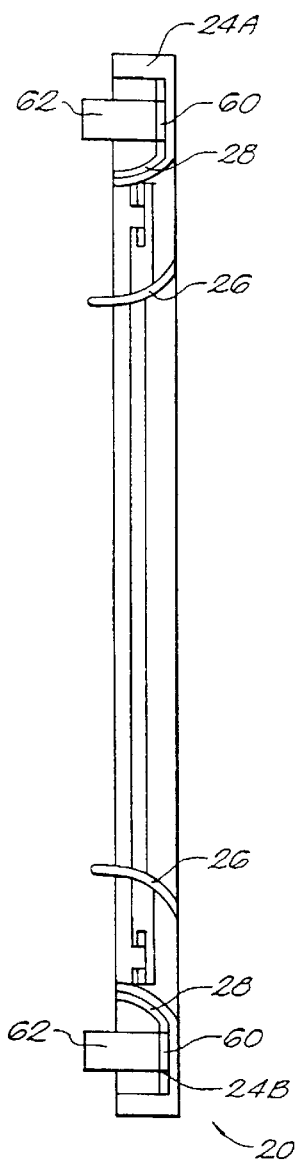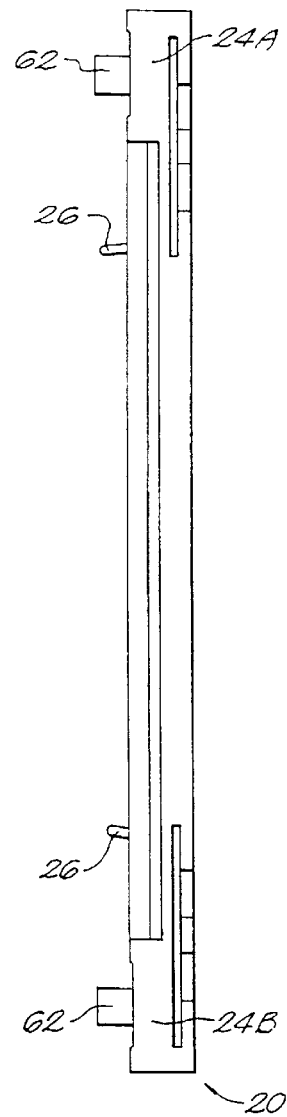
FIG. 5
FIG. 6
FIG. 7

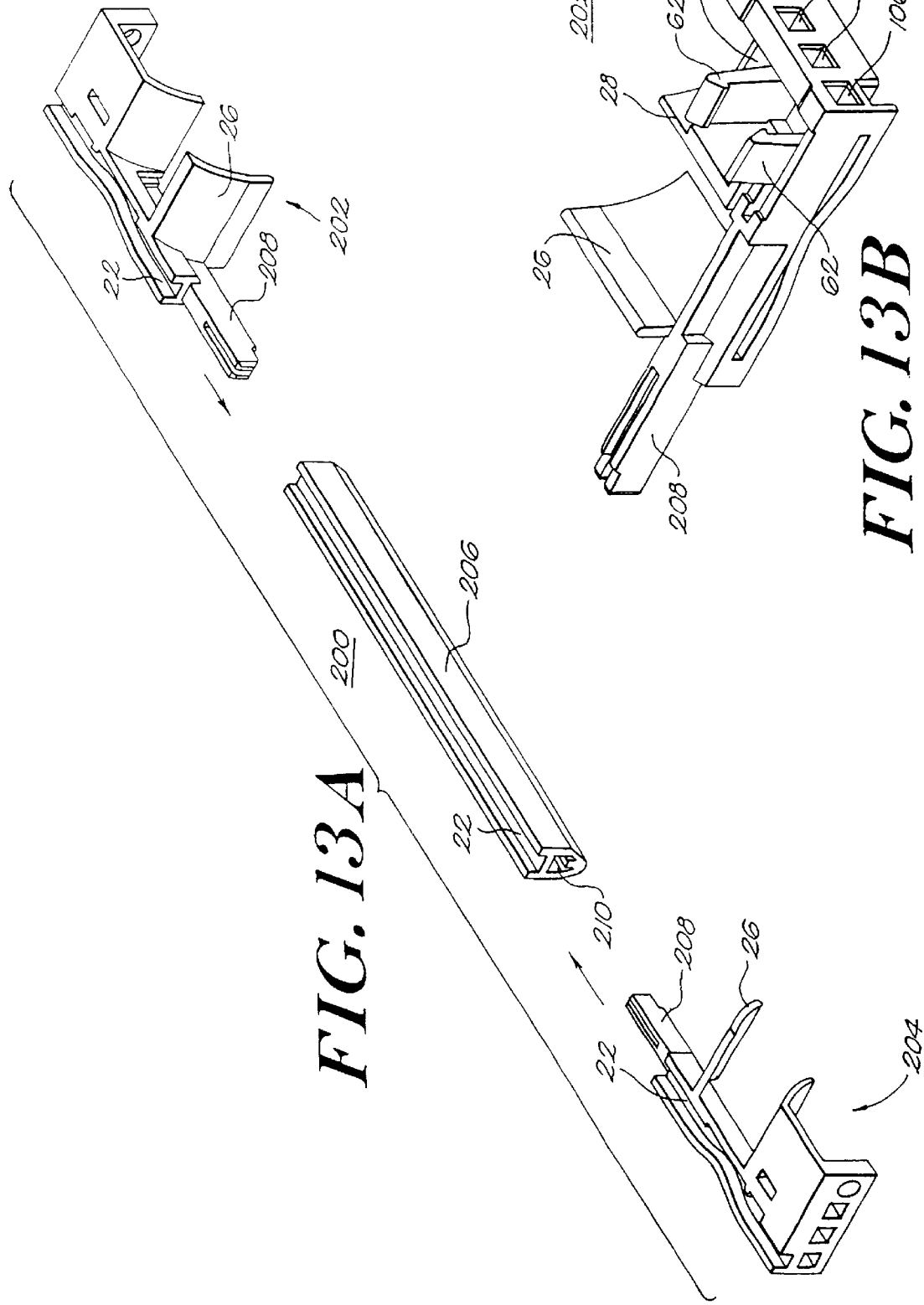

CARD GUIDE INCLUDING AIR DEFLECTOR MEANS AND AIR DEFLECTOR MEANS FOR A COOLING CARD GUIDE

RELATED APPLICATION

This application is a continuation-in-part of U.S. application Ser. No. 09/094,179, filed Jun. 9, 1998 which, in turn claims the benefit of U.S. Provisional Application No.: 60/085,627, filed on May 15, 1998, and assigned to the assignee of the present invention, the contents of both being incorporated by reference in their entirety.

BACKGROUND OF THE INVENTION

Modern backplanes, also referred to as motherboards, serve as a communication medium for the exchange of electronic signals between a plurality of daughter cards. Circuitry on each daughter card generates communication signals, which are distributed to connectors mounted along an edge of the daughter card. Daughter card connectors mate with a corresponding set of backplane connectors typically arranged in equidistant rows on the backplane for providing interconnect and distribution of signals therebetween.

A chassis houses the backplane, daughter cards, and corresponding connectors. The chassis frame includes side panels and cross members, also referred to as extrusion rails. Card guides mounted on the extrusion rails run from the front to the rear of the chassis to guide the daughter cards into proper alignment with corresponding backplane connectors. Each daughter card position in the chassis is referred to as a card slot. The relative positioning of the card guides with respect to the mother board is critical, since the relative positioning determines how well the daughter card connectors align with the motherboard connectors during daughter card insertion. Consequently, motherboard alignment has traditionally required special tooling and procedures, and has been a tedious and time-consuming aspect of chassis assembly.

In general, daughter cards to be inserted into a motherboard chassis assembly may accumulate a significant static charge during storage and handling. This static charge must be discharged prior to electrically coupling the daughter card to the system via the motherboard connector, so as to prevent ESD damage to the system. In addition, the front panel assembly of a daughter card may include a number of cable connectors electrically coupled to external cables. Such cables and cable connectors may also provide a source of significant static charge which must be discharged to prevent ESD damage to the system. A number of prior art methods exist for discharging daughter card ESD and for discharging front panel ESD. However, such prior art methods typically utilize separate, distinct mechanisms for discharging each source of static charge.

During operation, the electrical components on the daughter cards generate heat which must be extracted to prevent thermal damage. A popular means for inducing heat transfer is a cooling apparatus which forces a volume of cooled air through the chassis. The cooled air removes heat from the electrical components by means of thermal convection. The resulting warmed air is ventilated, or otherwise cooled and re-circulated.

As air flows past structural features on the chassis, for example the extrusion rails, the interference causes turbulence in the air flow. Turbulence results in regions of marginal air flow, which if proximal to the daughter cards, can cause "hot spots" to form on the daughter cards. To avoid this problem, card designers refrain from populating components in the "hot spot" regions, and card surface area is therefore underutilized. This is a most undesirable approach because as electronics become increasingly sophisticated, daughter card surface area is at a premium.

U.S. Pat. No. 4,750,088, issued Jun. 7, 1988 and incorporated herein by reference, addresses this issue by providing a number of air deflectors having a wedge-shaped cross section. The deflectors are extruded members mounted across the top and bottom portions of the chassis, parallel to the extrusion rails, for directing cooling air into marginal areas of the daughter cards, proximal to the extrusion rails. However, this configuration complicates construction of the chassis by requiring additional hardware which, in turn, lengthens the time and cost for production of the chassis assembly.

SUMMARY OF THE INVENTION

In a first aspect, the present invention relates to card guides, and more particularly to card guides which optimize the floyd of forced cooling air, provide for self alignment to a host motherboard and provide for integrated ESD (Electrostatic Discharge) hazard mitigation. The present invention is directed to a card guide configured to maximize air flow across circuit boards mounted in a card cage in a manner which mitigates and/or eliminates regions of marginal air flow. As a result, circuitry can be populated on the daughter card in regions proximal to the extrusion rails, allowing for more efficient use of daughter card surface area.

The present invention achieves this result in a manner which overcomes the limitations of the prior art. Specifically, air deflectors are incorporated into the body of the improved card guides, and the improved card guides are mounted to the chassis in a manner similar to the manner in which standard card guides are mounted. Unlike the prior art technique described above, additional hardware is not needed to redirect air flow about the extrusion rails and construction of the chassis is simplified.

A card guide in accordance with the present invention is adapted for mounting to a circuit card chassis having extrusion rails or cross members. The card guide is further adapted for channeling a daughter card toward a motherboard assembly, so as to ensure proper registration of the daughter card connector with a motherboard connector. The card guide comprises an elongated body having a groove along its longitudinal axis for receiving the edge of a circuit card. The body is adapted for mounting to the extrusion rails. At least one air deflector is laterally coupled to the body, and extends in a direction substantially transverse to the longitudinal axis for redirecting incident air flow about the rail. The portion of the card guide having the groove alone the longitudinal axis has a substantially "Y" shaped cross section to minimize the resistance presented by the card guide to incident air flow.

In a preferred embodiment, the air deflector is integral with the card guide. The air deflector is preferably arcuate in cross section to optimize the efficiency of air flow. Fabrication of the card guide may be accomplished via injection molding techniques, or by other techniques known in the art. Standard mounts are preferably included at opposite ends of the card guide body for mounting the card guide to the extrusion support rails. Additional air deflectors, integral with the mounts, may also be included. Mounting features of the mounts may include a latching mechanism which extends transversely from the body of the card guide, and fixedly engages a corresponding aperture in the support rail.

In a second aspect, the body of the card guide includes an ESD clip having a base, a wiper blade and a barrel receptacle, all three of which are electrically conductive and electrically coupled to one another. The base of the ESD clip includes a terminal for electrically coupling to the extrusion support rail. The wiper blade extends through the body into the groove along, the longitudinal axis so as to facilitate electrical coupling to a conductive edge of the daughter card. The barrel receptacle is disposed adjacent to and coaxial with a guide aperture in the card guide body. When a daughter card is inserted into the chassis and mates with the motherboard, the barrel receptacle receives and electrically couples to an electrically conductive guide pin fixedly attached to a front panel of the daughter card.

In a third aspect, the body of the card guide includes an alignment pin, fixedly attached to an end of said body proximal to the motherboard assembly. The alignment pin extends from the body in a direction substantially parallel to the longitudinal axis, and is operative to engage a corresponding aperture in said motherboard, so as to substantially align the card guide to the motherboard.

In a fourth aspect, the present invention is directed to an air deflector assembly existing as a stand-alone unit, not associated with any card guide. Such an air deflector assembly may be used to redirect air flow at unused or "expansion" portions of the card cage. Standard mounts are preferably included at opposite ends of the air deflector assembly for mounting the assembly to the extrusion support rails in the same mounting facilities used by the card guides. The air deflector assembly includes an interconnection mechanism that allows multiple air deflector assemblies to be stacked; i.e., connected in series or tandem configuration such that air flow may be redirected about larger areas of the card cage than for a single card slot position.

In a fifth aspect, the present invention is directed to a card guide mount for mounting a card guide assembly to a support rail of a daughter card chassis. The card guide mount includes a mounting feature having a latching mechanism that is operative to fixedly engage a corresponding aperture in the support rail, an interconnection feature for fixedly engaging a card guide rail having a longitudinal axis, and at least one air deflector extending from the body, for redirecting incident air flow. In one embodiment, the card guide rail includes an elongated body having a groove disposed substantially parallel to the longitudinal axis for receiving an edge of a daughter card. The air deflector may be substantially arcuate or wedged shaped in cross-section. The interconnection feature includes a tail piece extending from the card guide mount along an axis collinear with the guide rail longitudinal axis, and the tail piece fixedly engages a passage disposed within the guide rail along the longitudinal axis.

BRIEF DESCRIPTION OF THE DRAWINGS

The foregoing and other objects, features and advantages of the invention will be apparent from the more particular description of preferred embodiments of the invention, as illustrated in the accompanying drawings in which like reference characters refer to the same parts throughout the different views. The drawings are not necessarily to scale emphasis instead being placed upon illustrating the principles of the invention.

FIG. 3A is a front view of air flow across the face of a daughter card using conventional card guides;

FIG. 3B is a front view of air flow across the face of a daughter card using improved card guides having integral transversely-disposed air deflectors in accordance with the present invention;

FIG. 5 illustrates a bottom view of the card guide of FIG. 4;

FIG. 6 illustrates a first side view of the card guide of FIG. 4, including the face from which the air deflectors perpendicular extend;

FIG. 7 illustrates a second side view of the card guide of FIG. 4;

FIG. 13A illustrates an exploded perspective view of the components of a modular version of the card guide shown in FIG. 4;

FIG. 13B illustrates a second perspective view of the mounting bracket and deflector assembly shown in FIG. 13A;

DETAILED DESCRIPTION OF THE INVENTION

Figure 1:
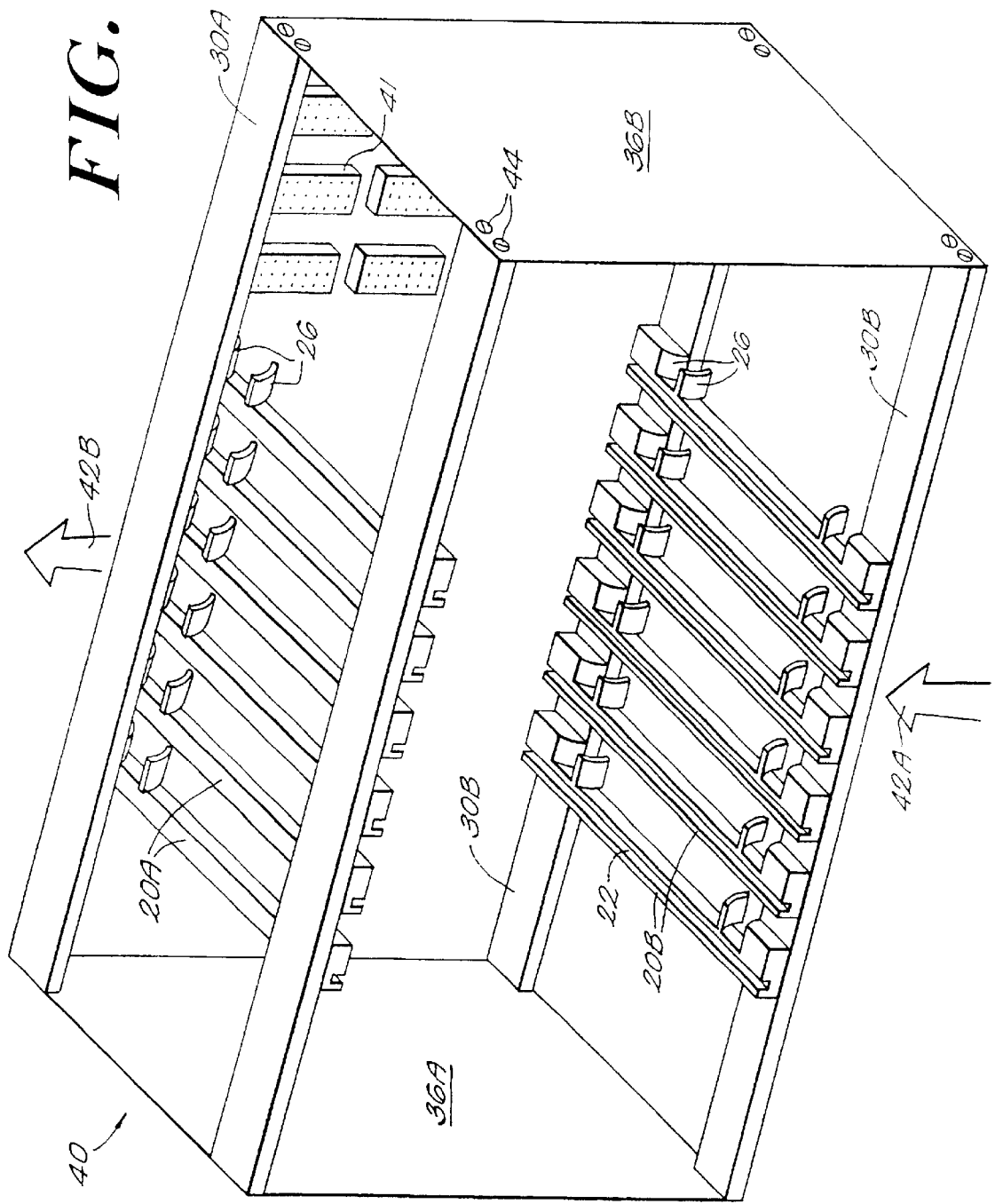
FIG. 1 is a perspective view of a card cage including card guides configured with lateral air deflectors in accordance with the present invention.

FIG. 1 is a perspective view of a card cage 40 including card guides 20A, 20B configured with lateral air deflectors 26 in accordance with the present invention. The card cage 40 comprises a substantially rectangular frame including a pair of opposing side panels 36A, 36B held in spaced, parallel relationship and coupled by means of upper and lower cross members 30A, 30B. A plurality of upper and lower card guides 20A, 20B are captively held, in a manner standard in the art, between front and rear cross member support rails 30A, 30B as shown in FIG. 1. The card guides 20A, 20B include a longitudinal groove 22 adapted to receive and align an inserted daughter card with backplane connector rows 41 at the rear of the card cage 40.

During operation, cooling air is pumped through the card cage 40 in the direction of arrow 42A. The cooling air 42A enters the lower portion of the card cage 40 between lower card guides 20B and about front and rear cross members 30B. Air deflectors 26 integral with the card guides 20A, 20B and extending laterally therefrom, preferably in a direction substantially transverse to the longitudinal axis of the guide, redirect the pumped air 42 about the cross members 30A, 30B. This promotes air flow across portions of the daughter card which otherwise would have been shielded by the body of cross members 30A, 30B and therefore would have been subject to marginal or nonexistent air flow. From there, the cooled air passes across the surface of the inserted daughter cards (not shown) and exits at the top portion of the card cage between upper card guides 20A and about front and rear upper cross members 30A in the direction of arrow 42B. The released air 42B, warmed by heat energy extracted from the daughter card components, is re-circulated and cooled, or otherwise vented.

In a preferred embodiment, the cross members 30A, 30B comprise extruded members, each member having a row of longitudinally-extending holes that are sized to receive screws 44 for mounting to side panels 36A, 36B. The cross members 30A, 30B include a series of evenly spaced apertures or sockets, in accordance with well-known configurations, adapted to captively secure card guides 20A, 20B and to ensure proper spacing and alignment of the card guides.

Figure 2:
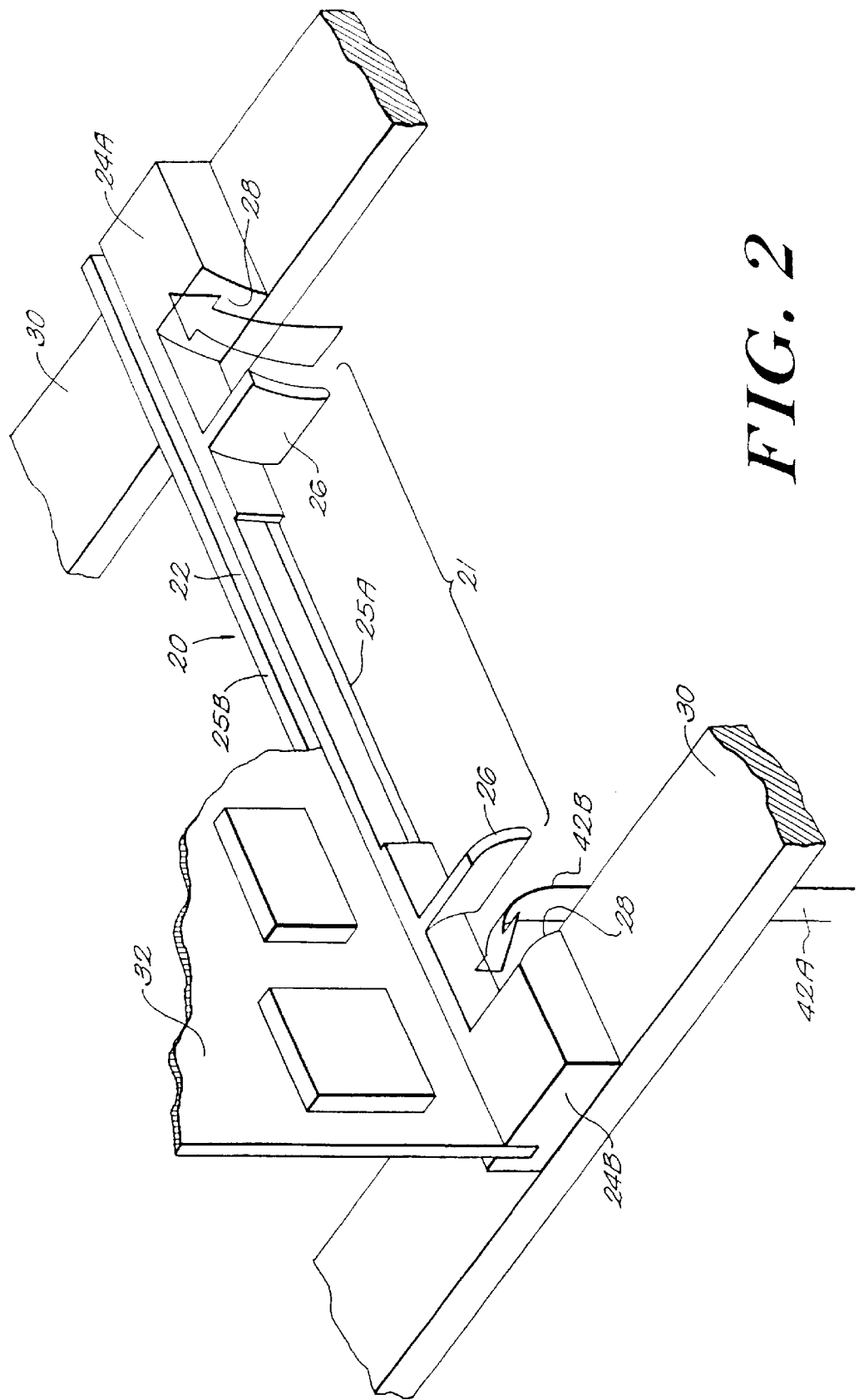
FIG. 2 is a close-up perspective view of a card guide mounted between extrusion rails, and an inserted daughter card in accordance with the present invention.

A close-up perspective illustration of a card guide 20 in accordance with a preferred embodiment of the present invention is illustrated in FIG. 2. The card guide 20 includes an elongated body 21 having a groove 22 along a longitudinal axis of the body 21. The groove 22 is adapted for receiving the edge of an inserted daughter card 32. Mounts 24A, 24B, shown integral with the body 21 in this configuration, are included for mounting the card guide 20 to the cross members 30A, 30B. In alternative embodiments described in more detail herein, the mounts 24A and 24B may be modular, and therefore separable from the body 21.

The card guide 20 further includes arcuate inner deflectors 26 and outer deflectors 28. Each pair of inner and outer deflectors 26, 28 respectively form a channel for redirecting incident air flow 42A, as shown in arrow 42B, toward regions of the daughter card which otherwise would be blocked by the air flow. In a preferred embodiment. the inner deflectors 26 extend laterally from the body 21, while the outer deflectors 28 are formed on the face of the mounts 24A, 24B as shown. Alternatively, the outer deflectors 28 man also extend laterally from the body 21. A number of deflectors 26, 28 may be positioned along the length of the body to redirect air flow, as needed.

The card guide body 21 preferably has a substantially Y-shaped cross-sectional profile including a narrow head 25A and a wide base 25B. Such a profile provides minimal resistance to air flow and therefore allows for increased cooling of components. The advantages of the Y-shaped profile card guides are fully described in U.S. Pat. No. 4,750,088, incorporated herein by reference. To likewise minimize resistance to air flow, the card guide body 21 may also include a substantially "V" shaped or wedged shaped cross section, or other aerodynamic cross section known to those in the art.

FIG. 3A is a front view of air flow across a daughter card 32 mounted in a chassis using card guides 20A, 20B in accordance with the prior art. Incident cooling air 42A flows about cross members 30A and 30B and past lower card guide 20B. This results in air turbulence which generates regions of marginal air flow 34, also referred to as "hot regions" proximal to the lower and upper cross members 30B, 30A.

FIG. 3B is a front view of a configuration employing card guides 20A, 20B in accordance with the present invention. Incident air 42A is redirected by air deflectors 26, 28 into the regions 34 proximal to the cross members 30B, mitigating and/or eliminating turbulence proximal to the extrusion rails. Likewise, in the exit area near the upper cross members 30A, the air deflectors 26, 28 promote air flow through regions 34 and mitigate turbulence. Components 53 populated in those regions 34 can therefore be properly cooled, allowing for efficient use of daughter card surface area.

In this manner, a card guide is provided which maximizes air flows across circuit boards mounted in a card case in a manner which mitigates and/or eliminates regions of marginal air flow. By incorporating air deflectors in the body of the card guides, construction of the chassis is simplified with respect to the prior art, and additional hardware is not necessary.

Preferred card guide dimensions are defined IEEE Mechanical Specification Draft 5.0 P1101.10, incorporated herein by reference, based on a universal standard set forth for well known VME 64 Extension and Compact PCI configuration. For example the card guide of the present invention may comprise a guide of width 0.8 inches at its widest point, designed for a printed circuit card of 160 mm in length.

The air deflector may be of a size ranging, for example, between 0.2 inches and 0.4 inches in width. The deflector preferably comprises a blade having inner and outer arcuate faces which preferably are parallel and of a radius between 0.35 and 0.5 inches. The arc is preferably 30 degrees to 90 degrees. In an alternative embodiment, the deflector may be configured in a wedge shape, as shown in U.S. Pat. No. 4,750,088. Other deflector arrangements are applicable. In a preferred embodiment, the card guides are fabricated from a relatively rigid plastic material, although in other embodiments the card guides may be fabricated from metal or composite materials known to those in the art. The card guides are preferably fabricated via injection molding techniques known to those in the art, although other techniques such as alternative molding, casting, stamping and extrusion may also be utilized to fabricate the card guides.

Figure 4:
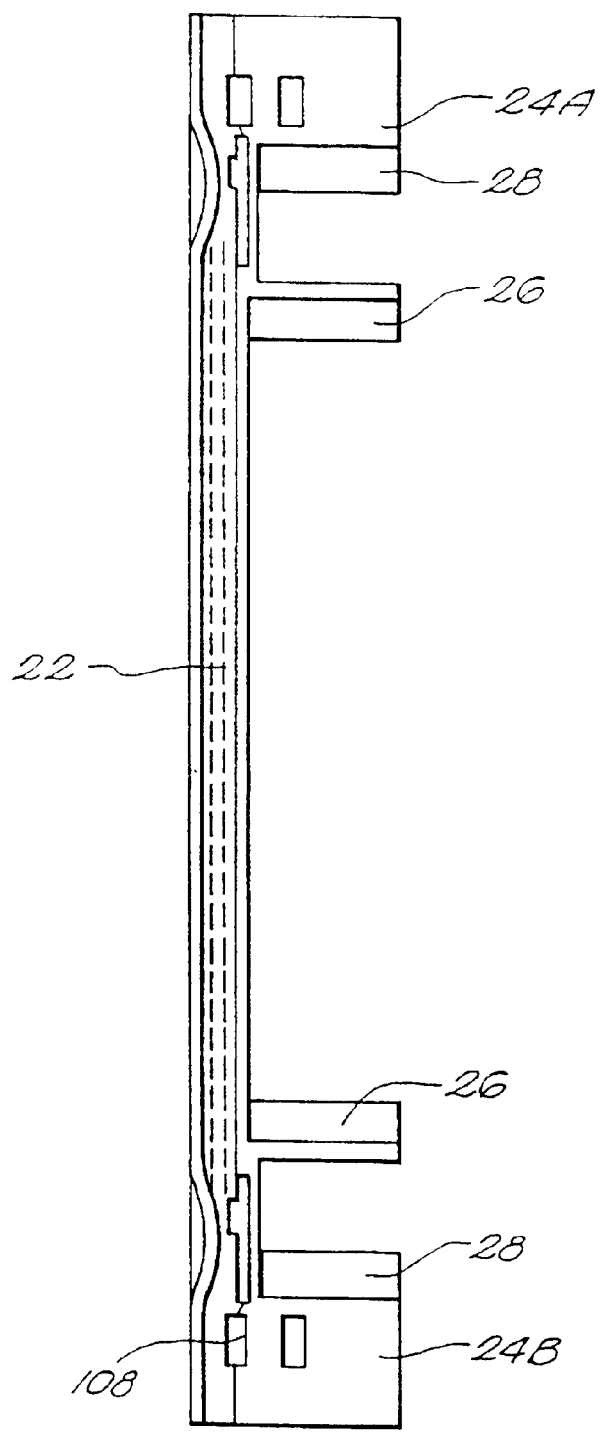
FIG. 4 illustrates a top view of a preferred embodiment of the card guide, including the face along which the longitudinal groove is disposed.
Figure 8:
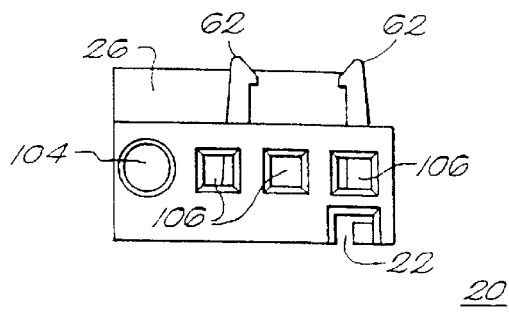
FIG. 8 illustrates an end view of the card guide of FIG. 4.
Figure 9:
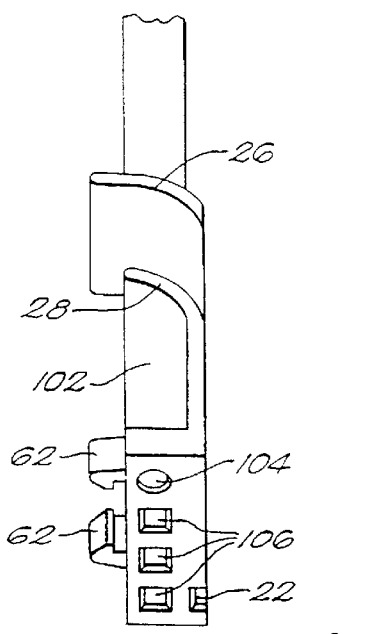
FIG. 9 illustrates a perspective view of the end of the card guide of FIG. 8.

FIGS. 4, 5, 6, 7, and 9 provide various views of a preferred embodiment of the card guide 20. FIG. 4 illustrates a view of the face of the card guide 20 along which the longitudinal groove 22 is disposed, and thus is adjacent to the inserted daughter card. FIG. 5 illustrates a view of the card guide 20 consistent with rotating the card guide 20 shown in FIG. 4 180 degrees about an axis collinear with the longitudinal groove 22. The face of the card guide 20 shown in FIG. 4 is adjacent to the cross members 30A, 30B (see FIGS. 1–3, above). The view in FIG. 5 also illustrates the integral card guide mounting clips 62 which latch into the apertures of the cross members 30A and 30B. FIG. 6 illustrates the face of the card guide 20 from which the air deflectors 26 perpendicularly extend. This view also illustrates an end view of the mounting clips 62. FIG. 7 illustrates a view of the card guide consistent with rotating the card guide as shown in FIG. 6 180 degrees about an axis collinear with the longitudinal groove 22. FIG. 8 illustrates an end view of the card guide 20. This view shows a round alignment aperture 104 and three square keying apertures 106. Key pins may be inserted into one or more of the three square keying apertures 106. The key pins are offset to one side, so that when they are inserted in a specific manner (as the offset can be in any of 4 positions), a particular card slot can be protected from the insertion of a module card into an incorrect slot. The round alignment aperture 104 has utility both as a socket for a fixedly attached alignment pin 120, and also as a receptacle for a guide pin mounted to a front panel of the daughter card, both uses are described in more detail hereinafter. In this preferred embodiment, the card guide 20 is symmetrical about a plane which perpendicularly intersects an axis which is collinear with the longitudinal groove 22, at a point which exactly bisects the length of the groove 22. Thus, a view of the opposite end of the card guide 20 is a mirror image of the view shown in FIG. 8. FIG. 9 illustrates an end of the card guide 20, tilted at an angle of approximately 45 degrees. This view shows the apertures 104 and 106 at the end of the card guide, along with a view of the cavity 102 within the mounts 24A and 24B.

Figure 10:
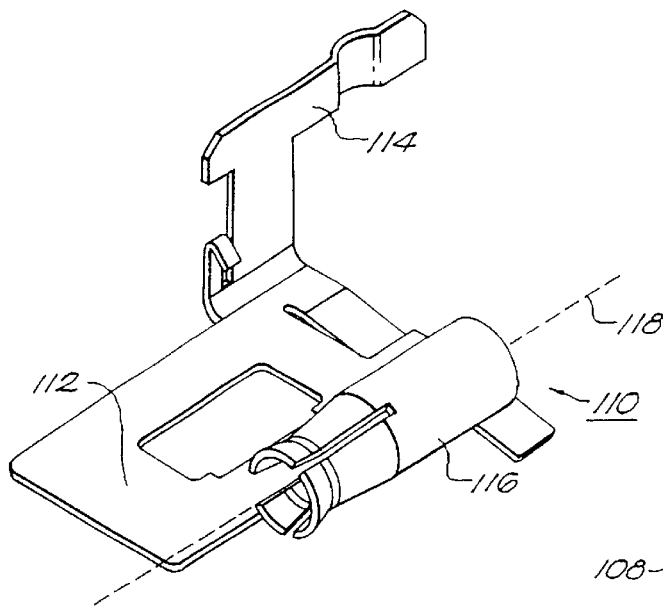
FIG. 10 is a perspective view of an ELSD clip in accordance with the present invention.

FIG. 10 shows a perspective view of an ESD clip 110. The ESD clip 110 provides means for dissipating static charge accumulated on a daughter card, prior to the daughter card engaging the motherboard. In the view of the card guide 20 shown in FIG. 5, the end of the card guide 20 distal to the motherboard includes a cavity 102 which houses the ESD clip 100. One side of the cavity 102 (which corresponds to the outward, end face of the card guide) includes a round guide pin aperture 104 and three square keying pin apertures 106. The side of the cavity which is adjacent to the longitudinal groove 22 includes a square aperture 108 which extends through the card guide and into the longitudinal groove shown in FIG. 4. The LSD clip 110 includes three ESD components; a base 112, a wiper blade 114 and a barrel receptacle 116, all of which are electrically conductive and electrically coupled to one another. In one preferred embodiment, the base 112, wiper blade 114 and barrel receptacle 116 are fabricated from a single piece of conductive material, although other embodiments may include non-conductive materials which provide mechanical support for separate, electrically conductive ESD components. The base of the ESD clip is electrically coupled to the cross member 30, which provides a current sink for the electrostatic charge accumulated on the daughter card.

The wiper blade 114 extends through the card guide 20 and into the longitudinal groove 22 (see FIG. 4) which guides the daughter card into the card cage. As the daughter card is inserted into the groove 22 of the card guide 20, a conductive strip located at the edge of the daughter card makes electrical contact with the wiper blade 114, so that a static charge built up on the daughter card may discharge from the conductive strip to the cross members 30 via the wiper blade 114 and base 112 of the ESD clip 110, as required by IEEE 1101.10.

The barrel receptacle 116 is disposed about a receptacle axis 118. The barrel receptacle 116 is positioned adjacent to an alignment aperture 104 in the front card guide face (see FIG. 8), such that the receptacle axis 118 is collinear with the axis of the alignment aperture 104. The axis of the alignment hole 104 intersects the center of the alignment aperture 104 and is perpendicular to the radius of the alignment aperture 104. As the daughter card is inserted into the card guide, a front panel guide pin fixedly attached and electrically coupled to the daughter card front panel travels along a path which is approximately collinear with the receptacle axis 118. As the daughter card completes its travel into the card cage 40 and the daughter card connector mates with the motherboard connector, the front panel guide pin travels through the alignment hole and electrically couples to the barrel receptacle 116.

In this manner, static discharge current (up to 25 amperes) from connectors mounted to the front panel can travel through the guide pin to the cross members 30 that support the card guide 20, via the barrel receptacle 116 and the base 112, thus mitigating the potential hazard of electrostatic discharge into the motherboard connector.

Figure 11:
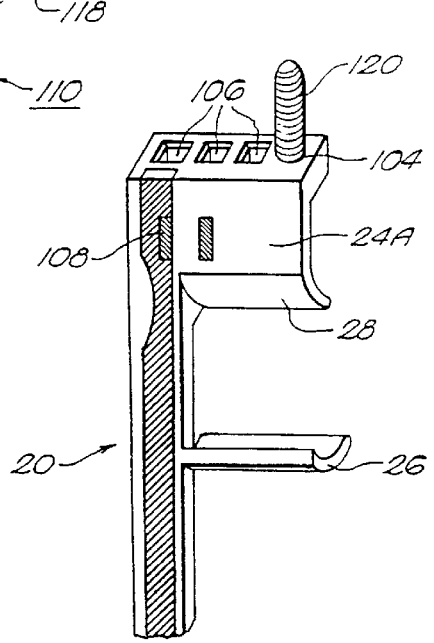
FIG. 11 is a perspective view of an alignment pin fixedly attached to a card guide, in accordance with the present invention.

FIG. 11 is a perspective view of an alignment pin 120 fixedly attached to a card guide 20, in accordance with the present invention. The alignment pin 120 is fixedly attached to an end of the card guide body proximal to the motherboard assembly, and extends from the body in a direction substantially parallel to the longitudinal axis of the card guide body. In a preferred embodiment of the invention, the alignment pin 120 is press-fit, in a manner known to those in the art, into the alignment aperture 104.

The alignment pin 120 engages a corresponding aperture in said motherboard, so as to substantially align the card guide to the motherboard without having to resort to traditional time consuming alignment procedures. Thus, the connectors of daughter cards inserted into the chassis via the card guides will substantially align to the corresponding motherboard connectors.

Figure 12:
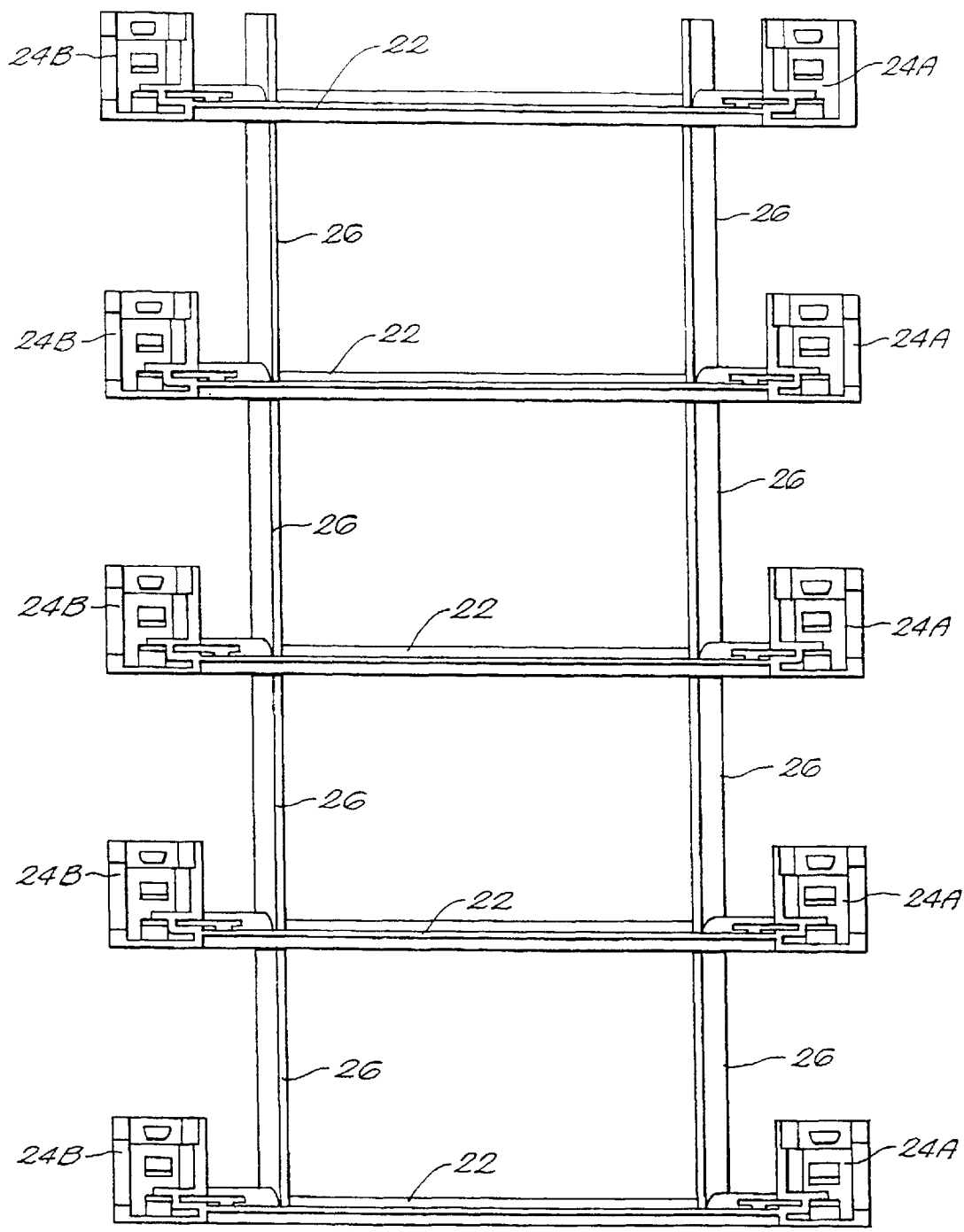
FIG. 12 shows an embodiment of the invention which includes two or more card guides joined by one or more elongated air deflectors having an arcuate cross section, forming an integral, multiple card guide unit.

Although the embodiment of the invention described above includes individual, discrete card (guides having integral air deflectors, other embodiments may include two or more card guides joined by one or more elongated air deflectors having an arcuate cross section, forming an integral, multiple card guide unit 130 as shown in FIG. 12. Alternatively, the multiple card guides may be joined by other means, such as integral or discrete cross-members with the elongated air deflectors being merely attached to the multiple card guides, rather than structurally joining the card guides.

Figure 14A:
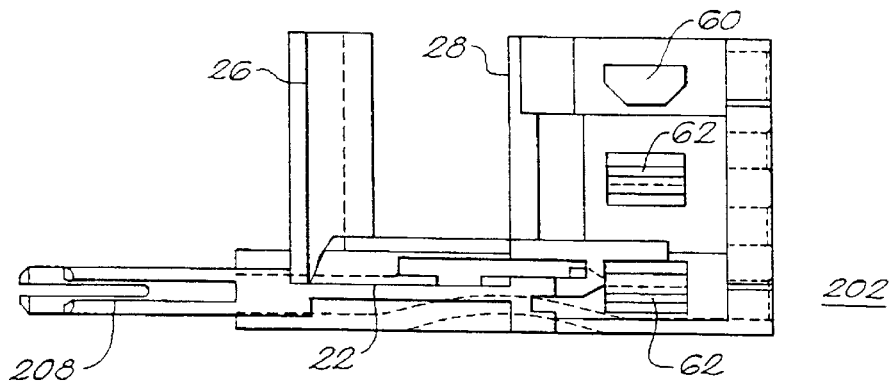
FIG. 14A shows a front view of a mounting bracket and deflector assembly shown in FIG. 13A.
Figure 14B:
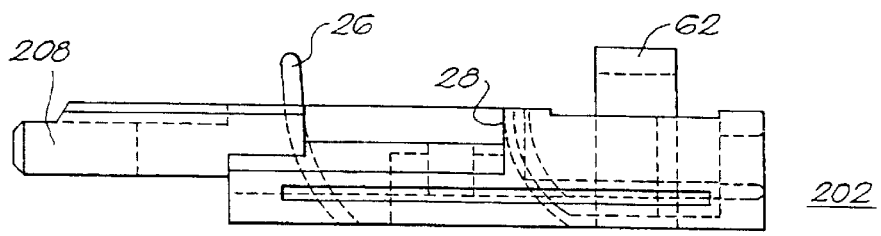
FIG. 14B shows a side view of a mounting bracket and deflector assembly shown in FIG. 13A.
Figure 14C:
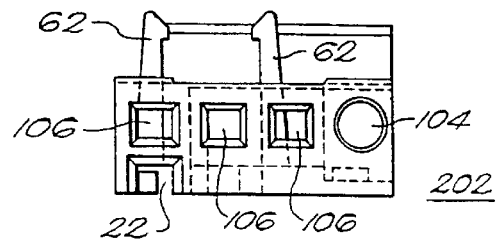
FIG. 14C shows a end view of the mounting bracket and deflector assembly shown in FIG. 13A.

In an alternative embodiment of the present invention (shown in FIG. 13A), a modular card guide 200 includes three distinct components; a first mounting bracket and deflector assembly 202, a second mounting bracket and deflector assembly 204, and a elongated guide rail 206. The features of the first and second mountings bracket and deflector assemblies 202 and 204 are substantially identical to the bracket/deflector features described in FIGS. 4–9 for the single-component card guide 20. The card guide rail 206 preferably has a substantially Y-shaped cross-sectional profile including a narrow head 25A and a wide base 25B, as described herein for the card guide body 21. The length of the elongated guide rail 206 is not fixed, but rather is selected to suit a particular application. FIG. 13A illustrates an exploded perspective view of the components of a modular version of the card guide 200 and FIG. 13B illustrates a second perspective view of the mounting bracket and deflector assembly 202. As shown in FIG. 13A, one end of the card guide rail 206 attaches to the first mounting bracket and deflector assembly 202 and the opposite end of the card guide rail 206 attaches to the second mountings bracket and deflector assembly 204. In the illustrated embodiment, a tail piece 208 is inserted into a channel 210 that exists within the guide rail 206. The rail 206 attaches to the mounting assemblies 202 and 204 by press fit, adhesive or by other methods known to those in the art. FIGS. 14A, 14B and 14C illustrate a front, side and end view, respectively, of the first mounting bracket and deflector assembly 202. The second bracket 204 is symmetrical with the first bracket 202, such that the first bracket 202 and the second bracket 204 are consistent with the two ends of the card guide 20 shown in FIG. 4. The embodiment of FIG. 13A offers the additional advantage of using the same two mounting brackets and deflector assemblies 202 and 204 to form a card guide of nearly any length by selecting an appropriate length for the elongated guide rail 206.

Figure 15:
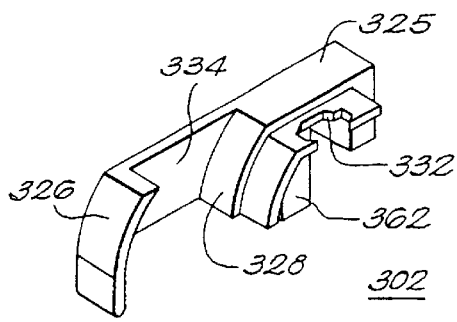
FIG. 15 illustrates a first perspective view of an extension deflector assembly for use in an expansion slot.
Figure 16:
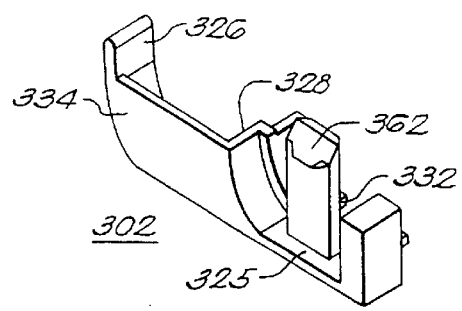
FIG. 16 illustrates a second perspective view of the extension deflector assembly shown in FIG. 15.
Figure 17A:
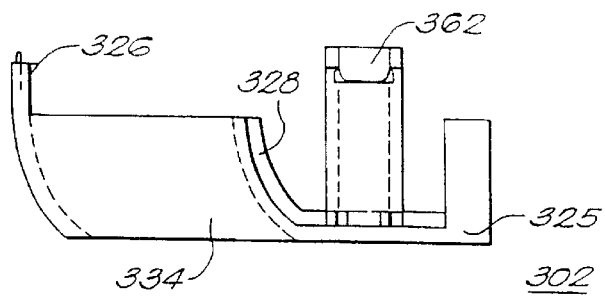
FIG. 17A shows a front view of the extension deflector assembly shown in FIG. 16A.
Figure 17B:
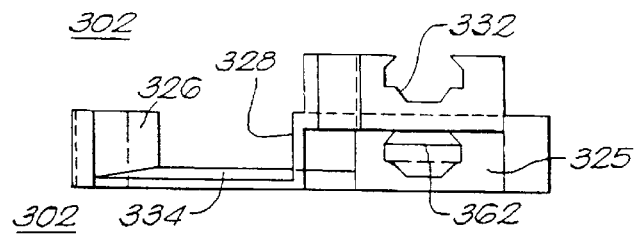
FIG. 17B shows a side view of the extension deflector assembly shown in FIG. 16A.
Figure 17C:
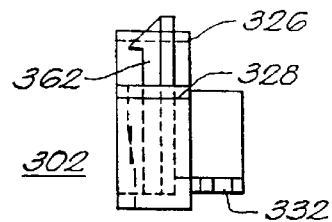
FIG. 17C shows an end view of the extension deflector assembly shown in FIG. 16A.
Figure 18A:
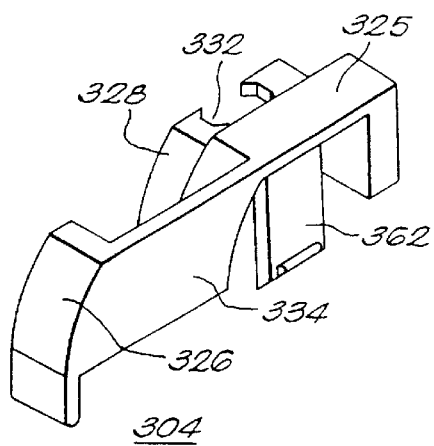
FIG. 18A shows a first perspective view of an extension deflector assembly corresponding to and symmetrical with the assembly shown in FIG. 17A.
Figure 18B:
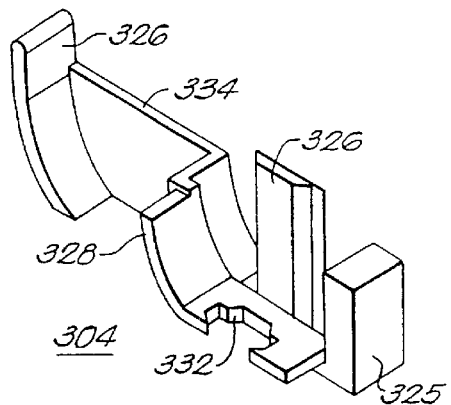
FIG. 18B shows a second perspective view of an extension deflector assembly corresponding to and symmetrical with the assembly shown in FIG. 17A.
Figure 19A:
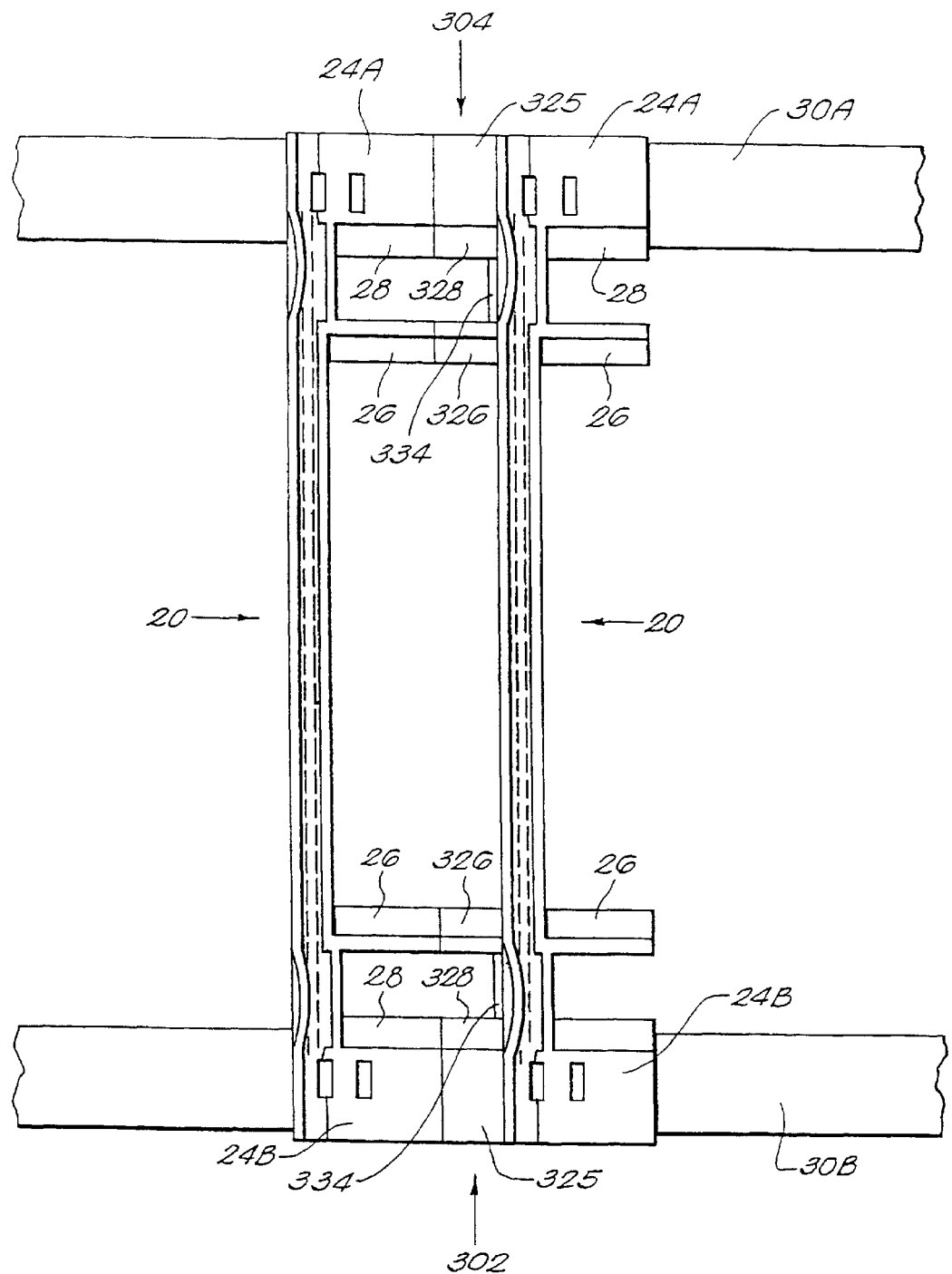
FIG. 19A shows an extension deflector assembly installed between a pair of card guides according to the present invention; and, FIG. 19B shows four extension deflector assemblies installed between a pair of card guides according to the present invention.

In another embodiment of the present invention, as shown in FIGS. 15–18, an extension deflector assembly 302 may be used in an expansion slot of a card cage 40 (see FIG. 1) where no card guide is installed; i.e., at a portion of the card cage 40 where no daughter card circuit module is to be present. The void that results from the absence of a card guide may cause or contribute to undesirable air flow patterns within the card cage. The extension deflector assembly 302 includes a mounting base 325, at least one mounting clip 362, an inner deflector 326, an outer deflector 328, a latching mechanism 332 and a supporting sidewall 334. The supporting sidewall 334 supports and anchors the inner deflector 326 to the mounting base 325. The mounting clip 362 attaches to a cross member 30A or 30B in the same way as described herein for the various card guide embodiments. The extension deflector assembly 302 provides the same air channeling function that the card guide 20 described herein, such that a more predictable and desirable air flow pattern may be achieved. FIG. 15 illustrates a first perspective view and FIG. 16 illustrates a second perspective view of the extension deflector assembly 302. FIGS. 17A, 17B and 17C illustrate a front, side and end view, respectively, of the extension deflector assembly 302. FIG. 18A illustrates a first perspective view and FIG. 18B illustrates a second perspective view of the a corresponding, symmetrical extension deflector assembly 304. The first extension assembly 302 may be used alone or in conjunction with second extension assembly 304, wherein the first assembly 302 is mounted to a cross member 30A (e.g., adjacent to mount 24B as shown in FIG. 19A) and the second assembly 304 is mounted to a cross member 30B (i.e., adjacent to mount 24A as shown in FIG. 19A). In a preferred embodiment, the latching mechanism 332 attaches (via press fit, "snap-locking," or other method known to those in the art) to a latching protrusion 60 on the mounting bracket 24A or 24B of the single piece card guide 20 (as shown in FIGS. 5 and 6) or on the modular mounting bracket and deflector assembly 202 or 204 (as shown in FIGS. 13B, 14A and 14C). In alternative embodiments, other methods may be used to secure the extension deflector 302 or 304 to a card guide assembly. As FIG. 19A shows, the extension deflector assembly 304 effectively extends the surfaces of the deflectors 26 and 28 of the card guide 20 so as to minimize air flow discontinuities. In general, the extension deflector assemblies 302 and 304 are narrower than the card guide deflector assemblies. The utility of this relationship is that one or more extension deflector assemblies may be used to fill a gap between card guide positions that is not an integral number of card guide widths, ensuring a continuous deflector surface between card guide positions.

Figure 19B:
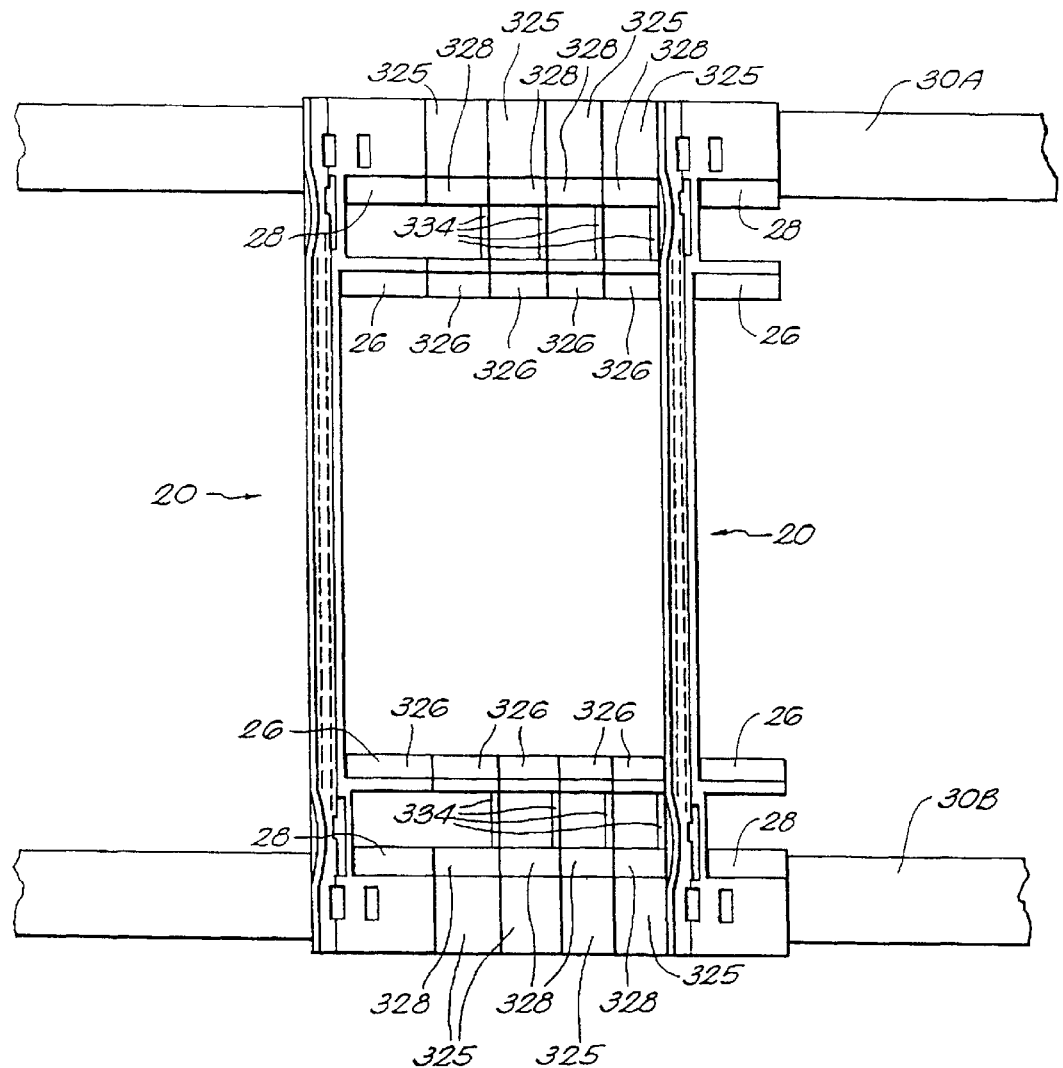

In one embodiment, a plurality of extension deflectors 302 (or a plurality of extension deflectors 304) may be combined to form a larger deflector assembly via press fitting, snap-locking, or other method known in the art) to one another rather than to card guides, as shown in FIG. 19B. In order to attach to one another, the extension assemblies 302 and 304 may include a latching protrusion 60 (not shown on the illustrated embodiment) similar to the protrusions described herein for the card guide mounting components, or the latching mechanism 332 of an extension assembly 302 or 304 may attach to the mounting clip 362 of another extension assembly 302 or 304, respectively.

While this invention has been particularly shown and described with references to preferred embodiments thereof, it will be understood by those skilled in the art that various changes in form and details may be made therein without departing from the spirit and scope of the invention as defined by the appended claims.

What is claimed is:

1. A card guide for guiding a daughter card toward a motherboard assembly, so as to ensure proper registration of a daughter card connector with a motherboard connector, said card guide mountable to support rails of a daughter card chassis, comprising:

a elongated body having a groove along a longitudinal axis of said body for receiving an edge of said daughter card; and at least one air deflector extending outwardly from said body in a direction transverse to the longitudinal axis, for redirecting incident air flow;

wherein the body comprises first and second opposed mounting brackets for mounting the card guide to the support rails, and an elongated guide rail extending between the mounting brackets, and removably coupled to at least one of the mounting brackets.

2. A card guide according to claim 1, wherein said air deflector is arcuate in cross-section.

3. A card guide according to claim 1, wherein said air deflector is substantially wedge shaped in cross section.

4. A card guide according to claim 1, further including a support rail having a curved edge surface substantially adjacent to said deflector, wherein said curved edge surface forms an extension of said deflector.

5. A card guide according to claim 1, wherein said air deflector is integral with said body, such that said air deflector and said body form a single unit.

6. A card guide according to claim 5, wherein said card guide is formed of a material selected from the group consisting of plastic, metal and composite material.

7. A card guide according to claim 5, wherein said card guide is formed via a fabrication technique selected from the group consisting of molding, injection molding, casting, stamping and extrusion.

8. A card guide according to claim 1, wherein said mounting brackets include a latching mechanism extending from said body, substantially transverse to said longitudinal axis, said latching mechanism being operative to fixedly engage a corresponding aperture in said support rail.

9. A card guide according to claim 1, wherein the at least one air deflector is positioned to redirect air about said support rails.

10. A card guide according to claim 1, wherein said body includes an ESD clip having a base, a wiper blade and a barrel receptacle, all three of which are electrically conductive and electrically coupled to one another, said base having a terminal for electrically coupling to said rail, said wiper blade extending through said body into said groove for electrically coupling to a conductive edge of said daughter card, and said barrel receptacle being disposed adjacent to and coaxial with a guide aperture in said body for receiving and electrically coupling to an electrically conductive guide pin fixedly attached to a front panel of said daughter card.

11. A card guide according to claim 1, wherein said body includes an alignment pin, fixedly attached to an end of said body proximal to said motherboard assembly, said alignment pin extending from said body in a direction substantially parallel to said longitudinal axis, and being operative to engage a corresponding aperture in said motherboard, so as to substantially align said card guide to said motherboard.

12. A card guide according to claim 1, wherein the at least one mounting bracket includes an elongated coupling extension and wherein the guide rail includes an elongated slot for receiving the coupling extension, for removably coupling the at least one mounting bracket and guide rail.

13. A card guide according to claim 1, wherein said air deflectors are integral with said mounting brackets.

14. A card guide according to claim 1, wherein said air deflectors are integral with said guide rail.

15. A card guide according to claim 1, wherein said guide rail includes a substantially "Y" shaped cross section so as to minimize resistance presented by said rail portion to said incident air flow.

16. A card guide according to claim 1 wherein the rail is of a variable length, such that the card guide is compatible with daughter card chasses of variable depths.

17. An air deflector assembly mountable to a support rail of a daughter card chassis, comprising an elongated body having at least one mounting bracket for securing said assembly to said support rail; and at least one air deflector extending outwardly from said body in a transverse direction from said body, the air deflector including an air deflecting surface extending in a transverse direction at an acute angle with respect to the support rail for redirecting incident air flow about the support rail.

18. An air deflector assembly according to claim 17, wherein said air deflector assembly is disposed substantially adjacent to a card guide, such that said at least one air deflector forms an extension to a corresponding air deflector on said card guide.

19. An air deflector assembly according to claim 17, wherein said air deflector is arcuate in cross-section.

20. An air deflector assembly according to claim 17, further including a connection mechanism for fixedly attaching said air deflector assembly to a second air deflector assembly such that a plurality of deflector assemblies may be combined without mounting each of said assemblies to said support rail.

21. A card guide mount for mounting a card guide assembly to a support rail of a daughter card chassis, comprising:

a mounting feature including a latching mechanism being operative to fixedly engage a corresponding aperture in said support rail;

an interconnection feature for fixedly engaging a card guide rail having a longitudinal axis; and at least one air deflector extending outwardly from said body in a transverse direction from said body, the air deflector including an air deflecting surface extending in a transverse direction at an acute angle with respect to the support rail for redirecting incident air flow about the support rail.

22. A card guide mount according to claim 21, wherein said card guide rail includes an elongated body having a groove disposed substantially parallel to said longitudinal axis for receiving an edge of a daughter card.

23. A card guide mount according to claim 21, further including a support rail having a curved edge surface substantially adjacent to said deflector, wherein said curved edge surface forms an extension of said deflector.

24. A card guide mount according to claim 21, wherein said air deflector is arcuate in cross-section.

25. A card guide mount according to claim 21, wherein said air deflector is substantially wedge shaped in cross section.

26. A card guide mount according to claim 21, wherein said interconnection feature includes a guide rail mount extending from said card guide mount along an axis collinear with said guide rail longitudinal axis.

27. A card guide mount according to claim 26, wherein said guide rail mount fixedly engages a longitudinal slot disposed within said guide rail along said longitudinal axis.

* * * * *